(12) United States Patent
Nad et al.

(10) Patent No.: US 12,740,459 B2
(45) Date of Patent: Sep. 15, 2026

(54) SUBSTRATE HAVING ONE OR MORE ELECTRICAL INTERCONNECTS

(71) Applicant: Intel Corporation, Santa Clara, CA (US)

(72) Inventors: Suddhasattwa Nad, Chandler, AZ (US); Steve Cho, Chandler, AZ (US); Marcel Arlan Wall, Phoenix, AZ (US); Onur Ozkan, Scottsdale, AZ (US); Ali Lehaf, Chandler, AZ (US); Yi Yang, Gilbert, AZ (US); Jason Scott Steill, Phoenix, AZ (US); Gang Duan, Chandler, AZ (US); Brandon C. Marin, Gilbert, AZ (US); Jeremy D Ecton, Gilbert, AZ (US); Srinivas Venkata Ramanuja Pietambaram, Chandler, AZ (US); Haifa Hariri, Phoenix, AZ (US); Bai Nie, Chandler, AZ (US); Hiroki Tanaka, Chandler, AZ (US); Kyle Mcelhinny, Tempe, AZ (US); Jason Gamba, Gilbert, AZ (US); Venkata Rajesh Saranam, Phoenix, AZ (US); Kristof Darmawikarta, Chandler, AZ (US); Haobo Chen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/855,040

(22) Filed: Jun. 30, 2022

(65) Prior Publication Data

US 2024/0006298 A1 Jan. 4, 2024

(51) Int. Cl.

| | |
|---|---|
| ***H10W 70/69*** | (2026.01) |
| ***H10W 70/05*** | (2026.01) |
| ***H10W 90/00*** | (2026.01) |
| ***H10W 99/00*** | (2026.01) |
| *H10W 70/65* | (2026.01) |

(52) U.S. Cl.

CPC ......... *H10W 70/69* (2026.01); *H10W 70/093* (2026.01); *H10W 90/701* (2026.01); *H10W 99/00* (2026.01); *H10W 70/65* (2026.01)

(58) Field of Classification Search

CPC ....... H01L 23/49866; H01L 23/53204–53252; H01L 23/5386; H01L 24/04–09; H01L 24/12–17; H01L 24/23–25; H01L 24/28–33

See application file for complete search history.

(56) References Cited

U.S. PATENT DOCUMENTS

2014/0102772 A1* 4/2014 Chen .................... H05K 3/4602 29/843
2015/0262866 A1* 9/2015 Meyer ..................... H01L 24/19 257/773

* cited by examiner

*Primary Examiner* — Evan G Clinton
(74) *Attorney, Agent, or Firm* — Akona IP PC

(57) ABSTRACT

An electronic device may include an integrated circuit, for instance a semiconductor die. The electronic device may include a substrate having a first layer and a second layer. The first and second layers may include interconnects recessed below a surface of the substrate. The substrate may include a passivation layer directly coupled with portions of the interconnects. A solder resist material may at least partially cover portions of the passivation layer directly coupled with the first interconnect surface.

31 Claims, 8 Drawing Sheets

SUBSTRATE HAVING ONE OR MORE ELECTRICAL INTERCONNECTS

TECHNICAL FIELD

This document pertains generally, but not by way of limitation, to an electronic device, for instance an electronic device having one or more of a substrate or an integrated circuit.

BACKGROUND

An electronic device may include an integrated circuit (e.g., a die, for instance a semiconductor die, or the like). The substrate may include a substrate, and the integrated circuit may be coupled with the substrate. In an approach, the substrate may include one or more substrate interconnects (e.g., pads, contacts, pillars, bumps, or the like). The integrated circuit may include one or more die interconnects (e.g., pads, contacts, pillars, bumps, or the like). The electronic device may include the die interconnects coupled with the substrate interconnects. For instance, solder may couple the die interconnects with the substrate interconnects. Accordingly, the substrate may provide a first-level interconnect for the integrated circuit.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
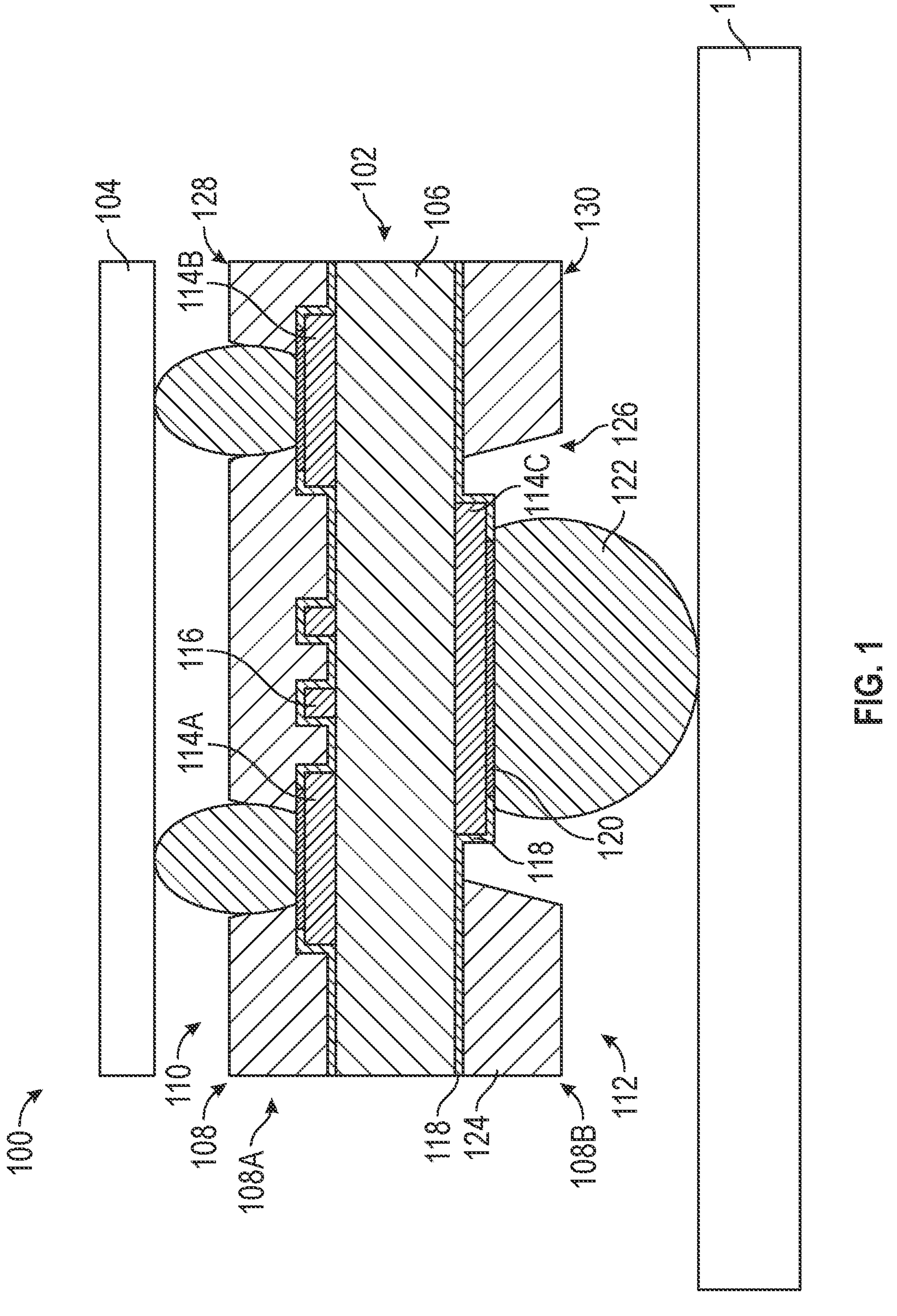
FIG. 1 is a schematic diagram of an example of an electronic device.

The present inventors have recognized, among other things, that a problem to be solved may include exposing (e.g., revealing, unveiling, uncovering, or the like) electrical interconnects recessed with respect to (e.g., below, under, or the like) a surface a substrate. For instance, the substrate may include one or more electrical interconnects and a solder resist material coupled with the electrical interconnects. The solder resist material may cover (e.g., envelop, surround, encompass, overlap, or the like) the electrical interconnects. In an example, the solder resist material is coupled with an interconnect surface of the one or more electrical interconnects. In some examples, portions of the solder resist material are removed from the electrical interconnects to expose the interconnect surface.

For example, removal of the solder resist material may include mechanical removal (e.g., agitation, cutting, drilling, grinding, or the like) of the solder resist material to expose the interconnect surface. In another example, mechanical removal may include smoothing of the interconnect surface. Portions of the interconnect surface may be mechanically removed, for instance to provide a surface finish to the interconnect surface. In an example, the surface finish enhances coupling of solder with the interconnect surface. In an approach, mechanical removal of the solder resist material or the interconnect surface may damage the substrate during manufacturing of the substrate. For instance, the substrate may be brittle, and stress generated by mechanical removal may fracture a portion of the substrate—leading to an electrical fault within (or physical breakage of) the substrate. Accordingly, mechanical removal of solder resist material may reduce manufacturing yield for the substrate.

The present subject matter can help provide a solution to this problem, such as with a passivation layer. The passivation layer facilitates surface finishing of the interconnect surface without mechanical removal of portions of the interconnect surface. The substrate may include one or more interconnects with a surface finish without mechanical removal of portions of an interconnect surface. Thus, the passivation layer may minimize stress applied to the substrate. As a result, the passivation layer may minimize fracture of the substrate. Accordingly, the passivation layer may improve manufacturing yield for the substrate. In another example, the passivation layer may minimize z-height (e.g., thickness, or the like) of the substrate. For instance, a thickness of the solder resist material on a first side of the substrate may be less than a thickness of the solder resist material on a second side of the substrate.

This overview is intended to provide an overview of subject matter of the present patent application. This overview is not intended to provide an exclusive or exhaustive explanation of the subject matter of the present patent application. The detailed description continues, and provides further information about the present patent application.

FIG. 1 is a schematic diagram of an example of an electronic device 100. The electronic device 100 may include a substrate 102. The electronic device 100 may include an integrated circuit, for instance a die 104. The die 104 may include a semiconductor material. The die 104 may be coupled to the substrate 102. For example, the substrate 102 may provide a first-level interconnect for the die 104.

The substrate 102 may include a core 106. The substrate may include one or more layers 108, for example one or more layers 108 coupled with the core 106. In an example, the substrate 102 may include one or more of a first layer 108A or a second layer 108B. The first layer 108A may be a on a first side 110 of the substrate 102 (with respect to the core 106). The second layer 108B may be a on a second side 112 of the substrate 102 (with respect to the core 106).

The substrate 102 may include one or more interconnects 114. The interconnects 114 (e.g., pads, contacts, pillars, bumps, or the like) may facilitate electrical communication between components coupled with the substrate 102. In an example, the substrate 102 may include one or more of a first interconnect 114A, a second interconnect 114B, or a third interconnect 114C. For instance, the first layer 108A may include the first interconnect 114A and the second interconnect 114B. The second layer 108B may include the third interconnect 114C. The first and second interconnects 114A, 114B may be coupled with the die 104. The third interconnect 108C may be coupled with a motherboard 117.

The substrate 102 may include one or more routing traces 116. The routing traces may facilitate electrical communication within the substrate 102. For example, the routing traces 116 may facilitate electrical communication between the first side 110 and the second side 112 of the substrate 102. In another example, the routing traces 116 facilitate electrical communication between two or more of the first interconnect 108A, the second interconnect 108B, or the third interconnect 108C.

Referring again to FIG. 1, the substrate 102 may include a passivation layer 118. The passivation layer 118 may protect one or more components of the substrate 102, for instance by protecting the interconnects 114 during a manufacturing operation for the substrate 102. For instance, the passivation layer 118 may protect the interconnects 114 in correspondence with coupling of a bonding layer 120 to the interconnects 114. The bonding layer 120 may provide a surface finish to the interconnects 114. The bonding layer 120 may provide a smooth surface to the interconnects 114. In an example, the bonding layer 120 enhances coupling of solder 122 with the interconnects 114. In another example, the bonding layer 120 and the solder 122 may form an intermetallic compound, for instance with heating (and flow) of the solder 122.

The substrate 102 may include a solder resist material 124. For example, the first layer 108A and the second layer 108B may include the solder resist material 124. In some embodiments, solder resist in accordance with this disclosure, such as material 124 comprises an epoxy polymer and includes at least carbon and oxygen. The substrate 102 may include the interconnects 114 within an opening 126 in the solder resist material 124. In an example, the first interconnect 114A and the second interconnect 114B may be recessed with respect to a first layer surface 128 of the first layer 108A. The third interconnect 114C may be recessed with respect to a second layer surface 130 of the second layer 108B. The first layer surface 128 and the second layer surface 130 may be exterior surfaces of the substrate 102. Accordingly, the first layer 108A and the second layer 108B may correspond with final layers 108 of the substrate 102.

Figures 2, 3, 4:
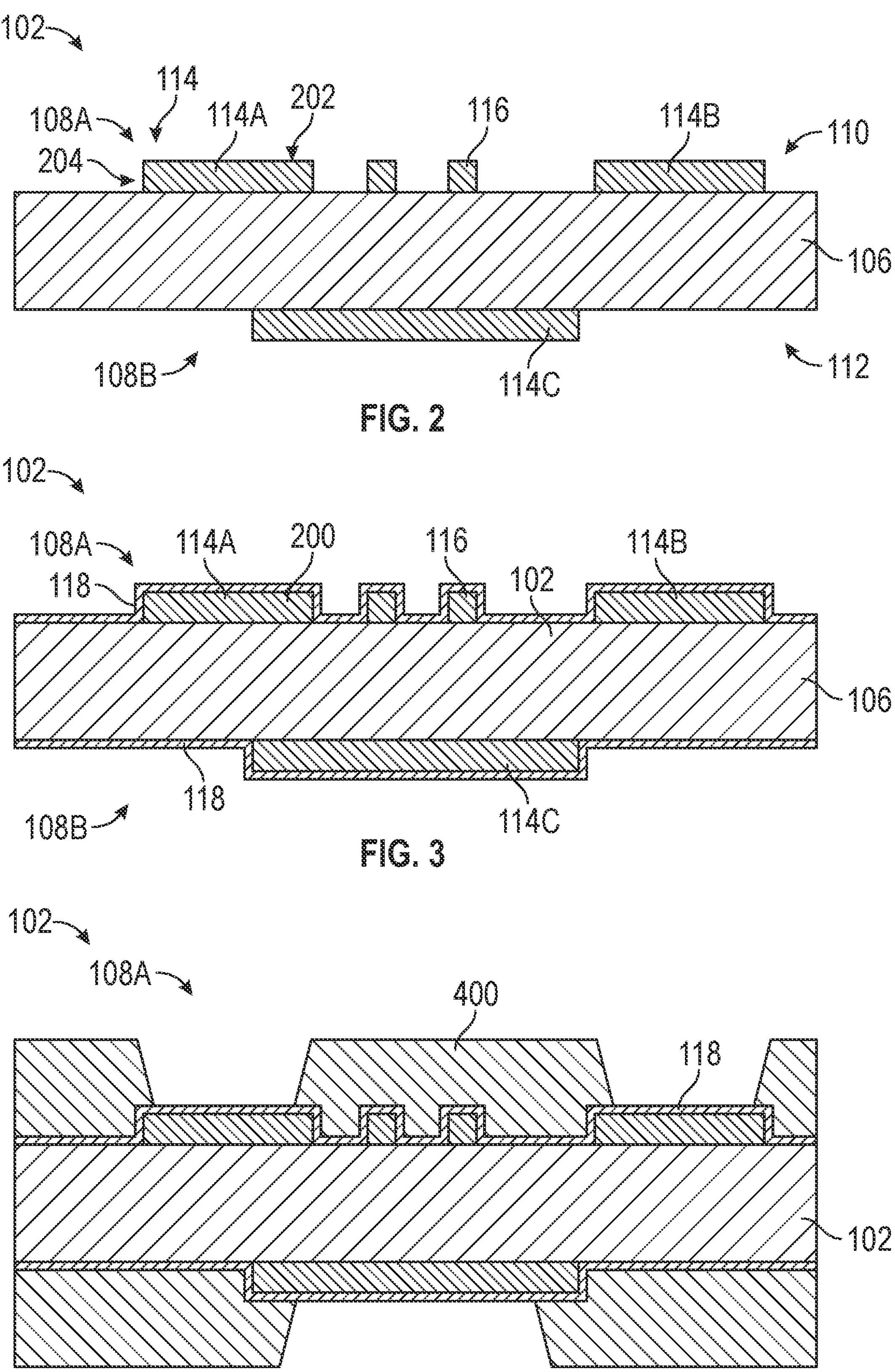
FIG. 2 is a schematic diagram of an example of a substrate during a manufacturing operation.
FIG. 3 is a schematic diagram of the substrate of FIG. 2 during another manufacturing operation.
FIG. 4 is a schematic diagram of the substrate of FIG. 2 during yet another manufacturing operation.

FIG. 2 is a schematic diagram of an example of the substrate 102 during a manufacturing operation. The substrate 102 may include the first layer 108A on the first side 110, and the second layer 108B on the second side 112. In an example, a conductive material (e.g., copper, aluminum, gold, silver, tin or the like) is coupled with the core 106. For instance, the conductive material 200 may be coupled with the core 106 using a plating operation.

FIG. 2 shows the first interconnect 114A having a first interconnect dimension (e.g., width, area, volume, or the like). The third interconnect has a second interconnect dimension. The second interconnect dimension may be greater than the first interconnect dimension. Accordingly, the third interconnect 114C may be larger than the first interconnect 114A. In an example, the first interconnect 114A is configured for coupling with a die, and the third interconnect 114C is configured for coupling with a motherboard. Thus, the substrate 102 facilitates communication between the die and the motherboard.

In an example, the first interconnect 114A, second interconnect 114B, third interconnect 114C, and routing traces 116 are coupled with the core 106. For instance, a photoimageable material is used to lithographically define portions of the first interconnect 114A, second interconnect 114B, third interconnect 114C, and routing traces 116. The photoimageable material may be cured (e.g., with a pattern or configuration corresponding with the interconnects 114 and routing traces 116). The conductive material 200 may be coupled to the core 106 (e.g., with a plating operation, electrolysis operation, or the like). The photoimageable material may be removed from the substrate 102, with the interconnects 114 and routing traces 116 remaining coupled with the core 106.

The interconnect 114A may have an interconnect surface 202 and a side surface 204. The side surface 204 may be adjacent to the interconnect surface 202. The side surface 204 may extend from the core 106. The interconnect surface 202 may be spaced from the core 106 by the side surface 204. In an example, the interconnect surface 202 is perpendicular to the side surface 204 (however the present subject matter is not so limited). Accordingly, the conductive material 200 for the interconnects 114 may have the interconnect surface 202 and the side surface 204.

FIG. 3 is a schematic diagram of the substrate 102 during another manufacturing operation. The passivation layer 118 may be coupled with portions of the substrate 102. For instance, the passivation layer 118 may be coupled with the core 106. The passivation layer 118 may be coupled with the conductive material 200. For instance, the passivation layer 118 may be coupled with the interconnect surface 202 and the side surface 204 (shown in FIG. 2) of the first interconnect 114A. In another example, the passivation layer 118 is coupled with the second interconnect 114B and the third interconnect 114C. In another example, the passivation layer 118 is coupled with the routing traces 116. Accordingly, the first and second layers 108A, 108B may include the passivation layer 118. In yet another example, the passivation layer 118 includes one or more of a silicon nitride compound material or a photoimageable dielectric material. For instance, in some embodiments, the passivation layer 118 includes silicon and nitrogen. Further, for instance, the passivation layer 118 may be coupled to the substrate using a vapor deposition operation (however the present subject matter is not so limited). The passivation layer 118 may be continuous.

FIG. 4 is a schematic diagram of the substrate 102 during yet another manufacturing operation. In an example, a photoimageable material 400 may be applied to the substrate 102. The photoimageable material 400 may be cured, and uncured portions of the photoimageable material 400 being removed from the substrate 102. Accordingly, the photoimageable material 400 may be patterned as shown in FIG. 4 (however the present subject matter is not so limited).

FIG. 4 shows the (cured) photoimageable material 400 coupled with the passivation layer 118. One or more openings 402 may be provided in the photoimageable material 400, for instance to facilitate access to the passivation layer 118. In an example, a solvent is applied to the substrate within the openings 126. The solvent may remove portions of the passivation layer 118, for instance portions of the passivation layer 118 without the (cured) photoimageable material 400. The photoimageable material 400 may be patterned to protect portions of the passivation layer 118 from the solvent. Accordingly, portions of the passivation layer 118 that are unprotected by the photoimageable material 400 may be removed with the solvent.

Figure 5:
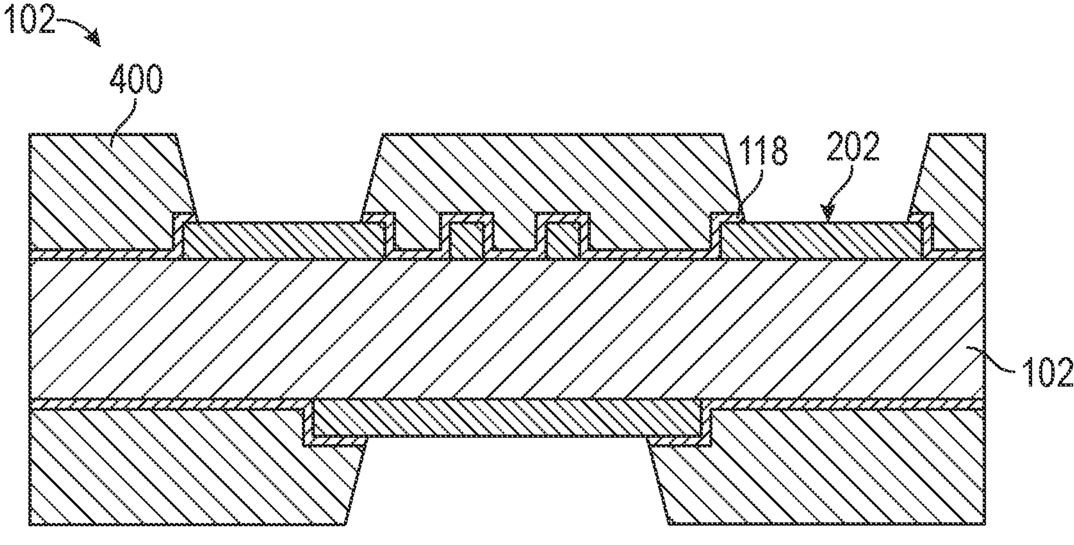
FIG. 5 is a schematic diagram of the substrate of FIG. 2 during still yet another manufacturing operation.

FIG. 5 is a schematic diagram of the substrate during still yet another manufacturing operation. FIG. 5 shows portions of the passivation layer 118 have been removed to expose at least a portion of the interconnect surface 202. FIG. 5 shows the passivation layer 118 coupled with the core 106, the side surface 204, and the interconnect surface 202. The passivation layer 118 may partially cover the interconnect surface 202 (because the portion of the interconnect surface 202 is exposed). In another example, the passivation layer 118 may cover the routing traces 116.

In some examples, the passivation layer 118 is separate from the interconnects 114. For instance, the photoimageable material 400 (shown in FIG. 4) may be patterned with the interconnect surface 202 and the side surface 204 (shown in FIG. 2) unprotected by the photoimageable material 400. Accordingly, the passivation layer 118 (coupled to the interconnect surface 202 and the side surface 204) is unprotected by the photoimageable material 400, and the solvent may remove the passivation layer 118 that is coupled to the interconnect surface 202 and the side surface 204. Thus, the passivation layer 118 may be coupled with the routing traces 116 and the core 106.

Figure 6:
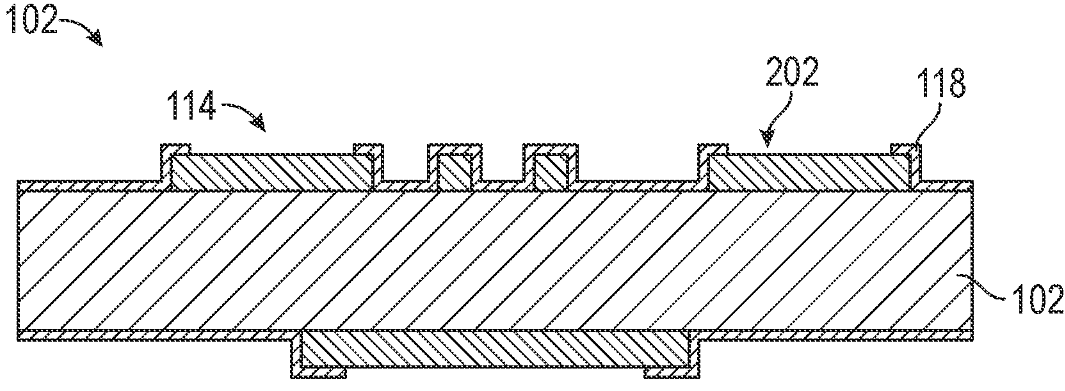
FIG. 6 is a schematic diagram of the substrate of FIG. 2 during a further manufacturing operation.

FIG. 6 is a schematic diagram of the substrate 102 during a further manufacturing operation. FIG. 6 shows the substrate 102 with the photoimageable material 400 (shown in FIG. 5) removed from substrate. Accordingly, the interconnect surface 202 for the interconnects 114 is exposed, and the passivation layer 118 is coupled with other portions of the interconnects 114. FIG. 6 shows the passivation layer 118 directly coupled with the interconnect surface 202 and the side surface 204 of the interconnects 114. For instance, the passivation layer 118 may be in direct contact with the interconnect surface 202 and the side surface 204. Additionally, FIG. 6 shows the passivation layer 118 directly coupled with the core 106. In contrast, FIG. 1 shows the die 104 coupled with the substrate 102 using the solder 122. For instance, a die contact 132 is directly coupled with the solder 122. The solder is directly coupled with the second interconnect 114B. Accordingly, the solder 122 couples the substrate 102 with the die 104. The die 104 is not directly coupled with the substrate, because the die contact 132 is not directly coupled with the interconnect 114B. Instead, the solder 122 is directly coupled with the die contact 132 and the interconnect 114B. In another example, the solder 122 is an intervening component between the die 104 and the substrate 102.

Figure 7:
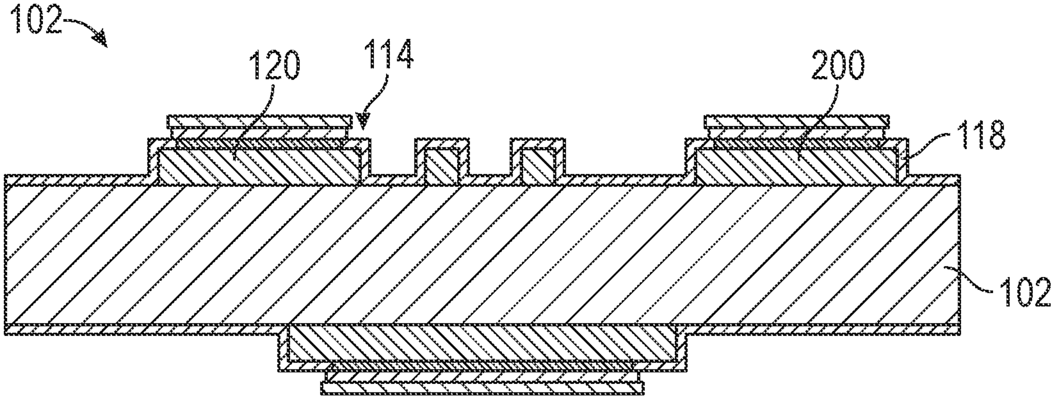
FIG. 7 is a schematic diagram of the substrate of FIG. 2 during a still further manufacturing operation.

FIG. 7 is a schematic diagram of the substrate during a still further manufacturing operation. In an example, the substrate 102 may include the bonding layer 120. The bonding layer 120 may include one or more metals. For instance, the bonding layer may include one or more of tin, silver, copper, or the like. The bonding layer 120 may provide a surface finish to the interconnect surface 202 (shown in FIG. 6). In an example, the surface finish enhances coupling of the solder 122 (shown in FIG. 1) with the interconnect surface 202 (or other portions of the interconnects 114). In another example, the bonding layer 120 smooths the interconnect surface 202. The bonding layer 120 may form an intermetallic compound with the solder 122 (shown in FIG. 1). FIG. 7 shows the bonding layer 120 directly coupled with the passivation layer 118. The bonding layer 120 is directly coupled with the conductive material 200 of the interconnects 114 (e.g., the interconnect surface 202, side surface 204, or the like).

Figure 8:
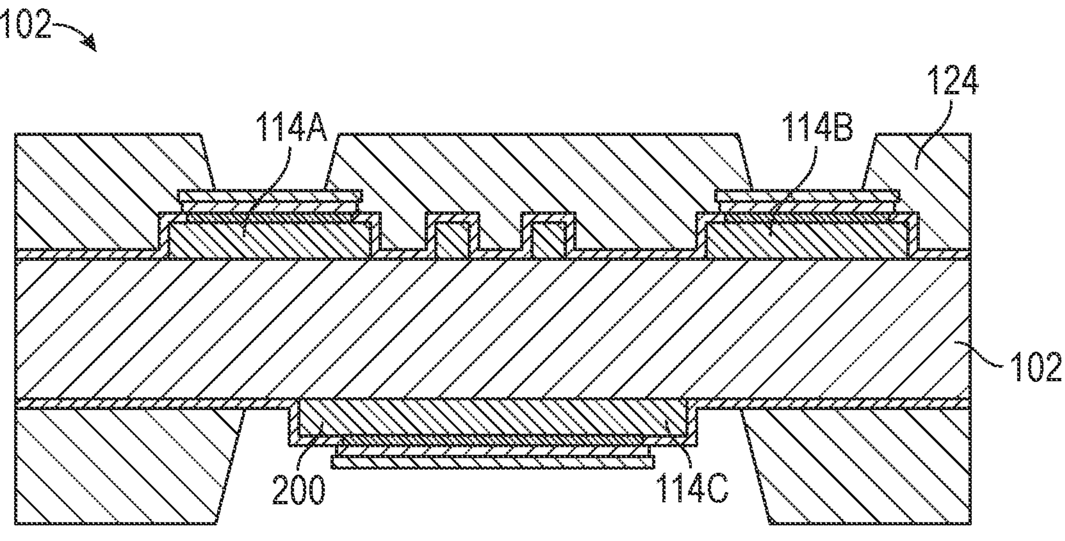
FIG. 8 is a schematic diagram of the substrate of FIG. 2 during a still yet further manufacturing operation.

FIG. 8 is a schematic diagram of the substrate during a still yet further manufacturing operation. In an example, the solder resist material 124 is coupled with portions of the substrate 102. For instance, FIG. 8 shows the solder resist material 124 covering portions of the first and second interconnect 114A, 114B. For instance, the solder resist material 124 may cover portions of the bonding layer 120. Accordingly, the interconnects 114A, 114B may be referred to as solder-resist-defined interconnects.

FIG. 8 shows the solder resist material 124 spaced from the third interconnect 114C. For instance, the solder resist material 124 may be spaced from portions of the passivation layer 118 that are (directly) coupled with the conductive material 200 of the interconnect 114C. For instance, the passivation layer 118 may be located between the side surface 204 and the solder resist material 124. Accordingly, the interconnect 114C may be referred to as a metal-defined interconnect.

Figure 9:
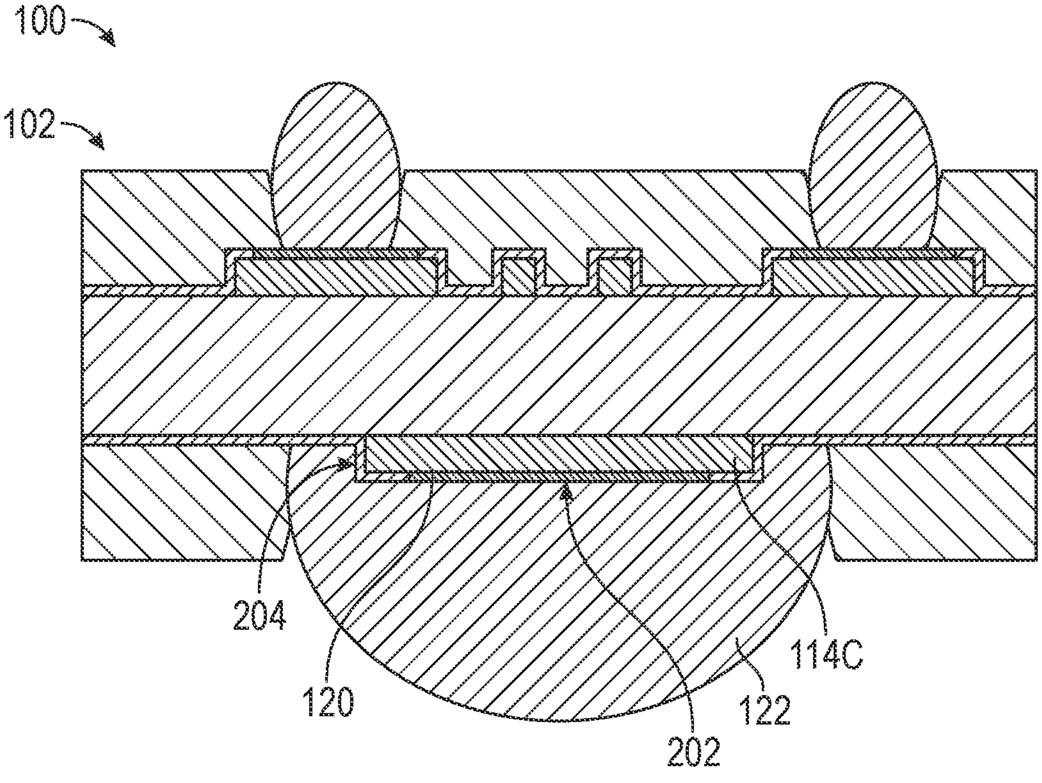
FIG. 9 is a schematic diagram of another example of the electronic device of FIG. 1.
Figure 10:
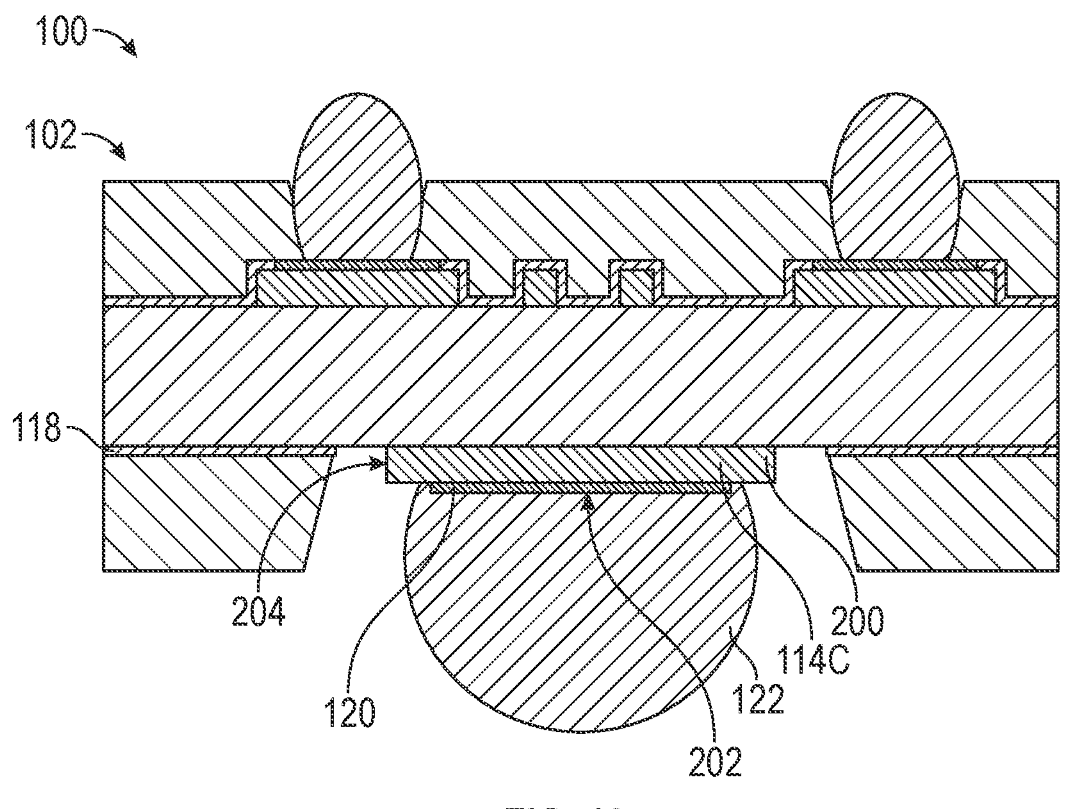
FIG. 10 is a schematic diagram of another example of the electronic device of FIG. 1.

FIG. 9 is a schematic diagram of another example of the electronic device of FIG. 1, including the substrate 102. FIG. 10 shows the solder 122 coupled with the bonding layer 120 at the interconnect surface 202. The solder 122 shown in FIG. 9 coupled with the passivation layer 118. In some examples, the solder 122 is coupled along the side surface 204 of the interconnect 114C. In contrast, FIG. 1 shows the solder 122 is not coupled along the side surface 204 (shown in FIG. 2) of the interconnect 114C. Instead, FIG. 1 shows the solder 122 coupled only along the interconnect surface 204 (shown in FIG. 2).

FIG. 10 is a schematic diagram of another example of the electronic device of FIG. 1, including the substrate 102. FIG. 10 shows the solder 122 coupled only along the interconnect surface 204. In another example, the passivation layer 118 is separate from the conductive material 200 of the interconnect 114C. In yet another example, the solder resist material 124 is separate from the interconnect 114C. For instance, the solder resist material 124 does not cover portions of the interconnect 114 in FIG. 10. In still yet another example, the passivation layer 118 and the solder resist material 124 may be spaced from the side surface 204 of the interconnect 114C.

Figure 11:
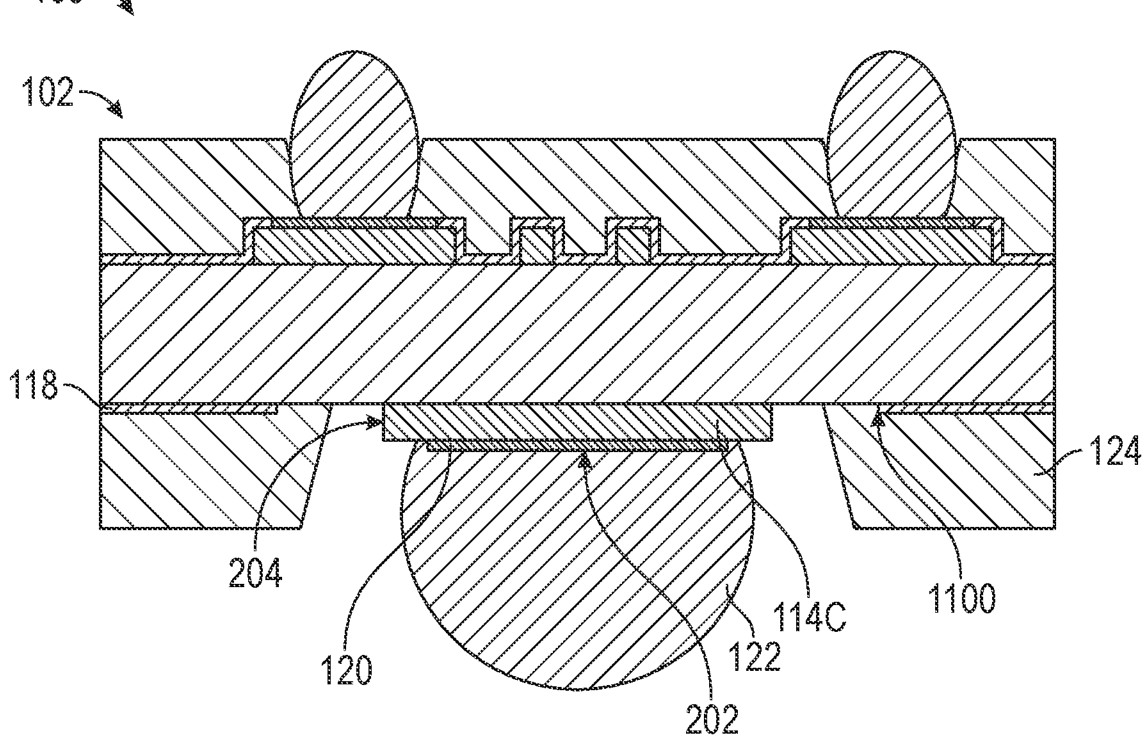
FIG. 11 is a schematic diagram of another example of the electronic device of FIG. 1.

FIG. 11 is a schematic diagram of another example of the electronic device of FIG. 1, including the substrate 102. FIG. 11 shows the solder resist material 124 covering the passivation layer 118. For example, FIG. 10 shows the solder resist material 124 located between the third interconnect 114C and the passivation layer 118. In contrast, FIG. 9 shows the solder resist material 124 is not between the third interconnect 114C and the passivation layer 118. In another example, the solder resist material 124 is between the side surface 204 of the third interconnect 114C and the passivation layer 118. In still yet another example, the solder resist material 124 may cover an end 1100 of the passivation layer 118. In a further example, FIG. 11 shows the solder 122 is coupled only along the interconnect surface 202.

Figure 12:
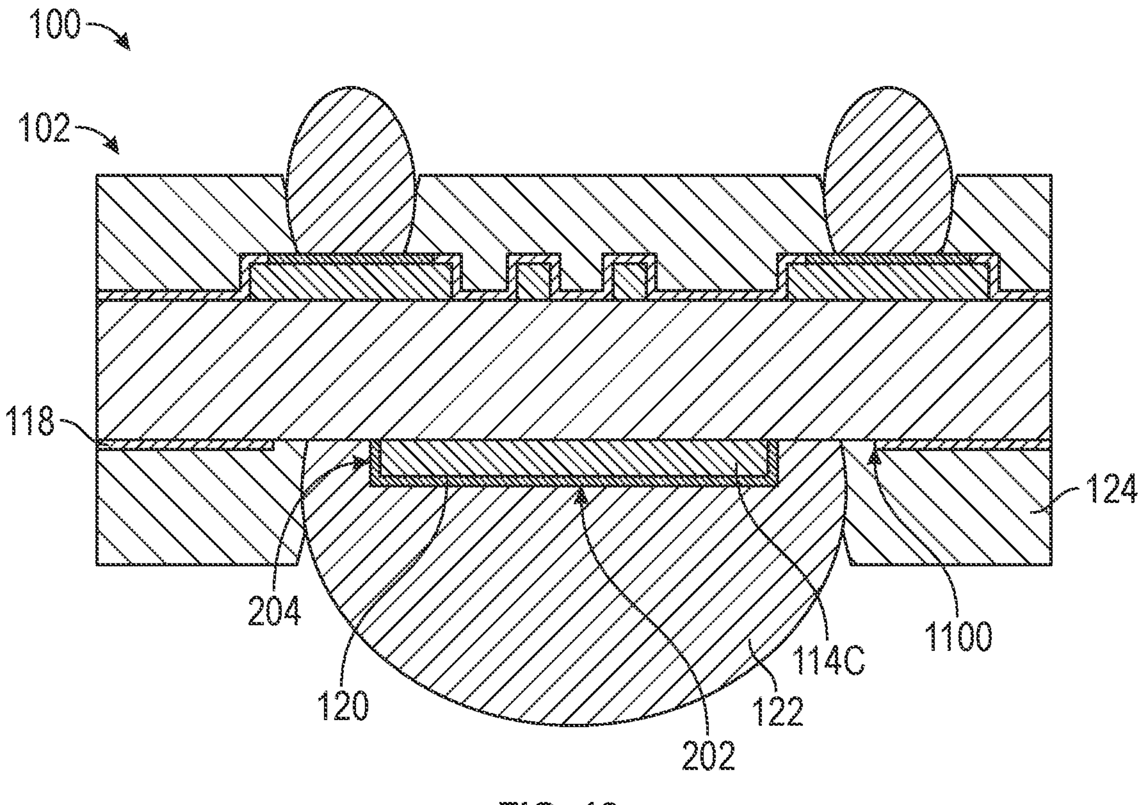
FIG. 12 is a schematic diagram of another example of the electronic device of FIG. 1.

FIG. 12 is a schematic diagram of another example of the electronic device of FIG. 1, including the substrate 102. FIG. 12 shows the bonding layer 120 directly coupled to the side surface 204 and the interconnect surface 202 of the third interconnect 114C. In another example, the solder 122 is coupled along the side surface 204 of the third interconnect 114C. In yet another example, the solder 122 is directly coupled with the solder resist material 124. In contrast, FIG. 11 shows the solder 122 separate from the solder resist material 124.

Figure 13:
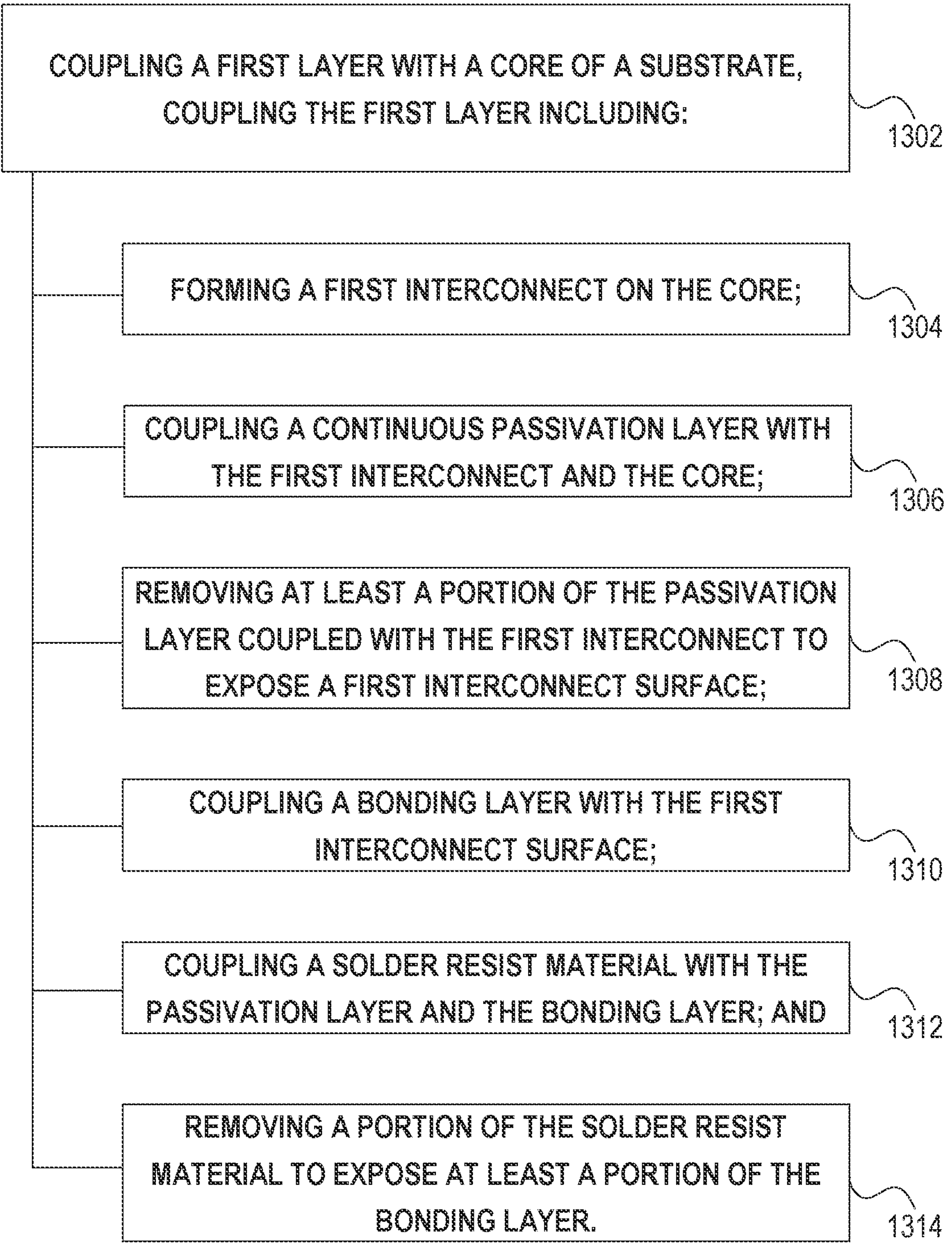
FIG. 13 is one example of a method for manufacturing an electronic device.

FIG. 13 is one example of a method 1300 for manufacturing an electronic device, including one or more of the electronic device 100 or the substrate 102 described herein. In describing the method 1300, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1300 include, but are not limited to, the corresponding numbered elements provided herein and other corresponding elements described herein (both numbered and unnumbered) as well as their equivalents.

At 1302, the method 1300 may include coupling a first layer 108A with a core 106 of a substrate 102. In an example, coupling the first layer 108A may include at 1304 forming a first interconnect 114A on the core 106. For instance, at 1306 a passivation layer may be coupled with the first interconnect 114A and the core 106. The method 1300 may include at 1308 removing at least a portion of the passivation layer 118 coupled with the first interconnect 114A to expose a first interconnect surface 202. In another example, the method 1300 may include at 1310 a bonding layer 120 is coupled with the first interconnect surface 202. At 1312, a solder resist material 124 may be coupled with the passivation layer 118 and the bonding layer 120. At 1314, a portion of the solder resist material 124 may be removed to expose at least a portion of the bonding layer 120.

Several options for the method 1300 follow. The passivation layer 118 may include one or more of a silicon nitride compound material or a photoimageable dielectric material. The method 1300 may include removing at least a portion of the passivation layer 118 coupled with the substrate 102 to expose a portion of the core 106. The solder resist material 124 may be coupled with the core 106. The method 1300 may include removing at least a portion of the solder resist material 124 coupled to the core 106.

Figure 14:
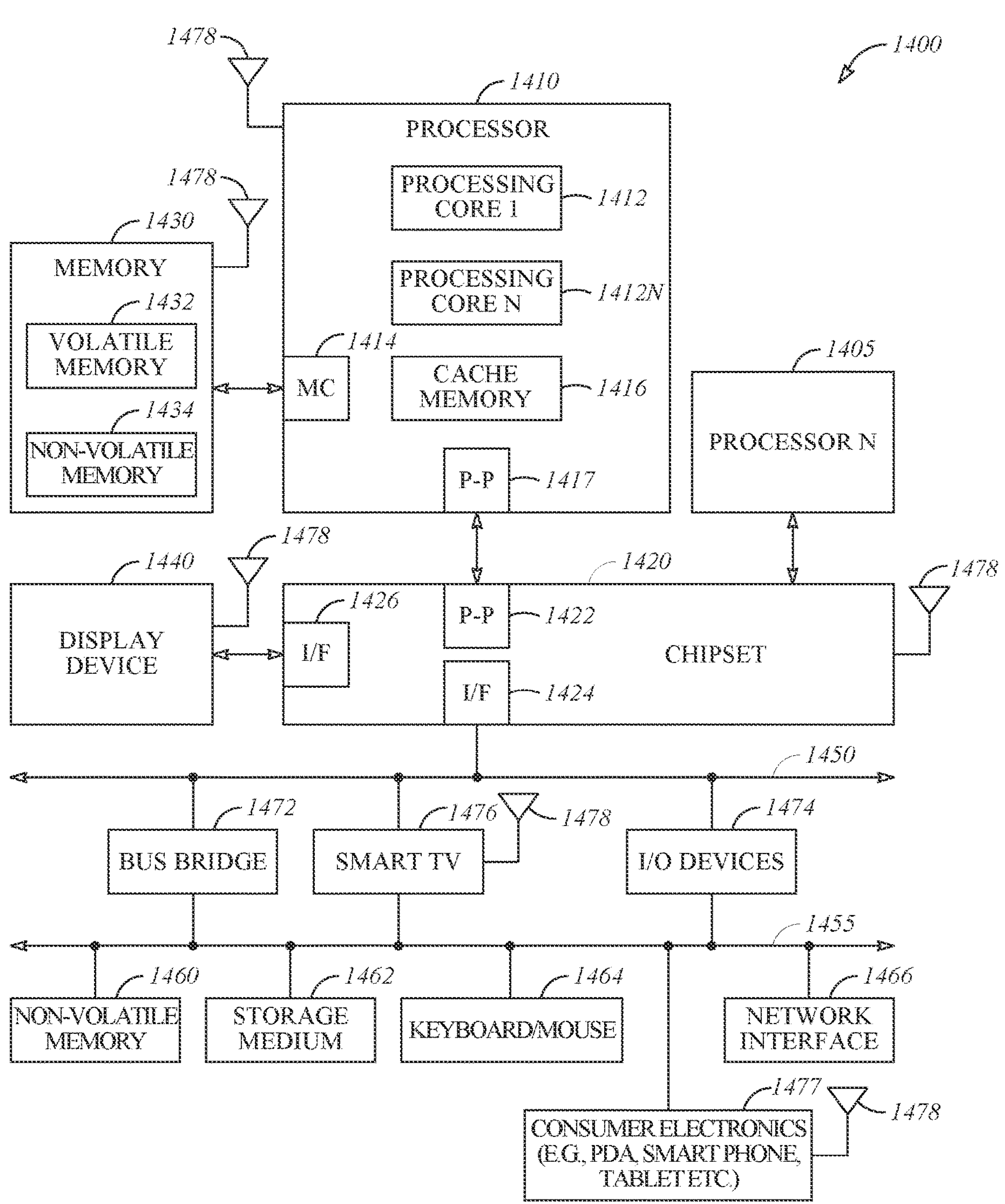
FIG. 14 is a system level diagram, depicting an example of an electronic device (e.g., system).

FIG. 14 is a system level diagram, depicting an example of an electronic device (e.g., system) including one or more of the electronic device 100 or the substrate 102 as described in the present disclosure. FIG. 14 is included to show an example of a higher level device application for one or more of the electronic device 100 or the substrate 102. In one embodiment, system 1400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1400 is a system on a chip (SOC) system.

In one embodiment, processor 1410 has one or more processor cores 1412 and 1412N, where 1412N represents the Nth processor core inside processor 1410 where N is a positive integer. In one embodiment, system 1400 includes multiple processors including 1410 and 1405, where processor 1405 has logic similar or identical to the logic of processor 1410. In some embodiments, processing core 1412 includes, but is not limited to, pre-fetch logic to fetch instructions, decode logic to decode the instructions, execution logic to execute instructions and the like. In some embodiments, processor 1410 has a cache memory 1416 to cache instructions and/or data for system 1400. Cache memory 1416 may be organized into a hierarchal structure including one or more levels of cache memory.

In some embodiments, processor 1410 includes a memory controller 1414, which is operable to perform functions that enable the processor 1410 to access and communicate with memory 1430 that includes a volatile memory 1432 and/or a non-volatile memory 1434. In some embodiments, processor 1410 is coupled with memory 1430 and chipset 1420. Processor 1410 may also be coupled to a wireless antenna 1478 to communicate with any device configured to transmit and/or receive wireless signals. In one embodiment, an interface for wireless antenna 1478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1434 includes, but is not limited to, flash memory, phase change memory (PCM), read-only memory (ROM), electrically erasable programmable read-only memory (EEPROM), or any other type of non-volatile memory device.

Memory 1430 stores information and instructions to be executed by processor 1410. In one embodiment, memory 1430 may also store temporary variables or other intermediate information while processor 1410 is executing instructions. In the illustrated embodiment, chipset 1420 connects with processor 1410 via Point-to-Point (PtP or P-P) interfaces 1417 and 1422. Chipset 1420 enables processor 1410 to connect to other elements in system 1400. In some embodiments of the example system, interfaces 1417 and 1422 operate in accordance with a PtP communication protocol such as the Intel® QuickPath Interconnect (QPI) or the like. In other embodiments, a different interconnect may be used.

In some embodiments, chipset 1420 is operable to communicate with processor 1410, 1405N, display device 1440, and other devices, including a bus bridge 1472, a smart TV 1476, I/O devices 1474, nonvolatile memory 1460, a storage medium (such as one or more mass storage devices) 1462, a keyboard/mouse 1464, a network interface 1466, and various forms of consumer electronics 1477 (such as a PDA, smart phone, tablet etc.), etc. In one embodiment, chipset 1420 couples with these devices through an interface 1424. Chipset 1420 may also be coupled to a wireless antenna 1478 to communicate with any device configured to transmit and/or receive wireless signals.

Chipset 1420 connects to display device 1440 via interface 1426. Display 1440 may be, for example, a liquid crystal display (LCD), a plasma display, cathode ray tube (CRT) display, or any other form of visual display device. In some embodiments of the example system, processor 1410 and chipset 1420 are merged into a single SOC. In addition, chipset 1420 connects to one or more buses 1450 and 1455 that interconnect various system elements, such as I/O devices 1474, nonvolatile memory 1460, storage medium 1462, a keyboard/mouse 1464, and network interface 1466. Buses 1450 and 1455 may be interconnected together via a bus bridge 1472.

In one embodiment, mass storage device 1462 includes, but is not limited to, a solid state drive, a hard disk drive, a universal serial bus flash memory drive, or any other form of computer data storage medium. In one embodiment, network interface 1466 is implemented by any type of well-known network interface standard including, but not limited to, an Ethernet interface, a universal serial bus (USB) interface, a Peripheral Component Interconnect (PCI)

Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 14 are depicted as separate blocks within the system 1400, the functions performed by some of these blocks may be integrated within a single semiconductor circuit or may be implemented using two or more separate integrated circuits. For example, although cache memory 1416 is depicted as a separate block within processor 1410, cache memory 1416 (or selected aspects of 1416) can be incorporated into processor core 1412.

VARIOUS NOTES & ASPECTS

Example 1 is a substrate for an electronic device, the substrate comprising: a first layer including a first interconnect and a first material, the first layer having a first layer surface and the first interconnect is recessed with respect to the first layer surface, wherein the first interconnect comprises a first interconnect surface and a first side surface adjacent the first interconnect surface; a second layer directly coupled with the first interconnect surface, the first side surface adjacent the first interconnect surface, and the first material; a third layer directly coupled with first interconnect surface and the second layer, the third layer configured for coupling with a first solder ball; and wherein the first material at least partially covers portions of the second layer directly coupled with the first interconnect surface; wherein the first material comprises carbon and oxygen; and wherein the second layer comprises silicon and nitrogen.

In Example 2, the subject matter of Example 1 optionally includes wherein: the first material comprises a solder resist material; the second layer comprises a passivation layer; and the third layer comprises a surface finish layer.

In Example 3, the subject matter of any one or more of Examples 1-2 optionally include a fourth layer including a second interconnect and the first material, the fourth layer having a fourth layer surface and the second interconnect is recessed with respect to the fourth layer surface; a fifth layer directly coupled with a second interconnect surface, a second side surface adjacent the second interconnect surface, and the first material; a sixth layer directly coupled with the second interconnect surface and the fifth layer, the sixth layer configured for coupling with a second solder ball; and wherein the first material is spaced from portions of the fifth layer directly coupled with the second interconnect surface and the second side surface adjacent the second interconnect surface.

In Example 4, the subject matter of Example 3 optionally includes wherein: the first interconnect has a first interconnect dimension; and the second interconnect has a second interconnect dimension greater than the first interconnect dimension.

In Example 5, the subject matter of any one or more of Examples 3-4 optionally include the first solder ball directly coupled with the third layer and the first material; and the second solder ball directly coupled with the sixth layer and the first material, and the second solder ball is located between the first material and a second side surface adjacent the second interconnect surface.

In Example 6, the subject matter of any one or more of Examples 3-5 optionally include wherein: the first material comprises a solder resist material; the second layer comprises a first passivation layer; the third layer comprises a first surface finish layer; the fifth layer comprises a second passivation layer; and the sixth layer comprises a second surface finish layer.

In Example 7, the subject matter of any one or more of Examples 1-6 optionally include wherein the first material at least partially covers portions of the third layer directly coupled with the first interconnect surface.

In Example 8, the subject matter of any one or more of Examples 1-7 optionally include wherein the second layer includes one or more of a silicon nitride compound material or a photoimageable dielectric material.

In Example 9, the subject matter of any one or more of Examples 1-8 optionally include a fourth layer including a second interconnect and the first material, the fourth layer having a fourth layer surface and the second interconnect is recessed with respect to the fourth layer surface; a fifth layer directly coupled with the second interconnect surface, the second side surface adjacent the second interconnect surface, and the first material; a sixth layer directly coupled with the second interconnect surface and the fifth layer, the sixth layer configured for coupling with a second solder ball; and wherein the first material at least partially covers portions of the fifth layer directly coupled with the first interconnect surface.

In Example 10, the subject matter of any one or more of Examples 1-9 optionally include a fourth layer having a fourth layer surface, wherein: the fourth layer includes a second interconnect and the first material; the second interconnect is recessed with respect to the fourth layer surface; a fifth layer coplanar with a portion of the second interconnect and directly coupled with the first material, wherein the fifth layer is spaced from the second interconnect; a sixth layer directly coupled with the second interconnect surface, the sixth layer configured for coupling with a second solder ball; and wherein the first material is spaced from the second interconnect.

In Example 11, the subject matter of Example 10 optionally includes wherein the first material is located between the second interconnect and the fifth layer.

In Example 12, the subject matter of Example 11 optionally includes the second solder ball, and the second solder ball is directly coupled with the sixth layer and the first material.

In Example 13, the subject matter of any one or more of Examples 11-12 optionally include one or more electrical routing traces included in the first layer, and the second layer is coupled with the one or more electrical traces.

In Example 14, the subject matter of any one or more of Examples 1-13 optionally include a die coupled with the first interconnect of the substrate, and the substrate is a first-level interconnect for the die.

Example 15 is a substrate for an electronic device, the substrate comprising: a substrate core having a first side and a second side; a first layer coupled with the first side of the substrate core, wherein: the first layer includes a first interconnect and a first material; the first interconnect comprises a first interconnect surface and a first side surface adjacent the first interconnect surface; the first layer includes a second layer directly coupled with the first interconnect surface, the first side surface adjacent the first interconnect surface, and the first material; and the first material at least partially covers portions of the second layer directly coupled with the first interconnect surface; and a third layer coupled with the second side of the substrate core, wherein: the third layer includes a second interconnect and the first material; the third layer includes a fourth layer coplanar with a portion of the second interconnect and directly coupled with the first material, wherein: the fourth layer is spaced from the second interconnect; and the first material is spaced from the second interconnect.

In Example 16, the subject matter of Example 15 optionally includes wherein the first material is located between the second interconnect and the fourth layer.

In Example 17, the subject matter of Example 16 optionally includes a fifth layer directly coupled with a second interconnect surface of the second interconnect; and a solder ball directly coupled with the fifth layer and the first material.

In Example 18, the subject matter of any one or more of Examples 15-17 optionally include wherein the fourth layer includes one or more of a silicon nitride compound material or a photoimageable dielectric material.

In Example 19, the subject matter of any one or more of Examples 15-18 optionally include a die coupled with the first interconnect of the substrate, and the substrate is a first-level interconnect for the die.

Example 20 is a method for manufacturing an electronic device, the method comprising: coupling a first layer with a core of a substrate, coupling the first layer including: forming a first interconnect on the core; coupling a continuous second layer with the first interconnect and the core; removing at least a portion of the second layer coupled with the first interconnect to expose a first interconnect surface; coupling a third layer with the first interconnect surface; coupling a first material with the second layer and the third layer; and removing a portion of the first material to expose at least a portion of the third layer.

In Example 21, the subject matter of Example 20 optionally includes wherein the second layer includes one or more of a silicon nitride compound material or a photoimageable dielectric material.

In Example 22, the subject matter of any one or more of Examples 20-21 optionally include removing at least a portion of the second layer coupled with the substrate to expose a portion of the core.

In Example 23, the subject matter of Example 22 optionally includes coupling the first material with the core; and removing at least a portion of the first material coupled to the core.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A substrate for an electronic device, the substrate comprising:

a first layer including a first interconnect and a first material, the first layer having a first layer surface and the first interconnect is recessed with respect to the first layer surface, wherein the first interconnect comprises a first interconnect surface and a first side surface adjacent the first interconnect surface;

a second layer directly coupled with the first interconnect surface, the first side surface adjacent the first interconnect surface, and the first material;

a third layer directly coupled with first interconnect surface and the second layer;

a fourth layer including a second interconnect and the first material, the fourth layer having a fourth layer surface and the second interconnect is recessed with respect to the fourth layer surface;

a fifth layer directly coupled with a second interconnect surface, a second side surface adjacent the second interconnect surface, and the first material; and a sixth layer directly coupled with the second interconnect surface and the fifth layer;

wherein the first material at least partially covers portions of the second layer directly coupled with the first interconnect surface, wherein the first material comprises carbon and oxygen, and wherein the second layer comprises silicon and nitrogen.

2. The substrate of claim 1, wherein:

the first material comprises a solder resist material, the second layer comprises a passivation layer, and the third layer comprises a surface finish layer.

3. The substrate of claim 1, wherein:

the first material is spaced from portions of the fifth layer directly coupled with the second interconnect surface and the second side surface adjacent the second interconnect surface.

4. The substrate of claim 3, wherein:

the first interconnect has a first interconnect dimension, and the second interconnect has a second interconnect dimension greater than the first interconnect dimension.

5. The substrate of claim 3, further comprising:

a first solder ball coupled with the third layer and the first material; and a second solder ball coupled with the sixth layer and the first material, wherein the second solder ball is between the first material and a second side surface adjacent the second interconnect surface.

6. The substrate of claim 3, wherein:

the first material comprises a solder resist material, the second layer comprises a first passivation layer, the third layer comprises a first surface finish layer, the fifth layer comprises a second passivation layer, and the sixth layer comprises a second surface finish layer.

7. The substrate of claim 1, wherein the first material at least partially covers portions of the third layer directly coupled with the first interconnect surface.

8. The substrate of claim 1, wherein the second layer includes one or more of a silicon nitride compound material or a photoimageable dielectric material.

9. The substrate of claim 1, wherein:

the first material at least partially covers portions of the fifth layer directly coupled with the first interconnect surface.

10. The substrate of claim 1, further comprising a die coupled with the first interconnect of the substrate, and the substrate is a first-level interconnect for the die.

11. The substrate of claim 1, wherein:

the third layer is to couple with a first solder ball, and the sixth layer is to couple with a second solder ball.

12. A substrate for an electronic device, the substrate comprising:

a substrate core having a first side and a second side;

a first layer coupled with the first side of the substrate core, wherein:

the first layer includes a first interconnect and a first material, the first interconnect comprises a first interconnect surface and a first side surface adjacent the first interconnect surface, the first layer includes a second layer in contact with the first interconnect surface, the first side surface adjacent the first interconnect surface, and the first material, and the first material at least partially covers a portion of the second layer; and a third layer coupled with the second side of the substrate core, wherein:

the third layer includes a second interconnect and the first material, the third layer includes a fourth layer coplanar with a portion of the second interconnect and in contact with the first material, the fourth layer is spaced from the second interconnect, and the first material is spaced from the second interconnect.

13. The substrate of claim 12, wherein the first material is located between the second interconnect and the fourth layer.

14. The substrate of claim 13, further comprising:

a fifth layer directly coupled with a second interconnect surface of the second interconnect; and a solder ball directly coupled with the fifth layer and the first material.

15. The substrate of claim 12, wherein the fourth layer includes one or more of a silicon nitride compound material or a photoimageable dielectric material.

16. The substrate of claim 12, further comprising a die coupled with the first interconnect of the substrate, and the substrate is a first-level interconnect for the die.

17. The substrate of claim 12, wherein the portion of the second layer is a portion of the second layer in contact with the first interconnect surface.

18. A substrate for an electronic device, the substrate comprising:

a first layer including a first interconnect and a first material, the first layer having a first layer surface and the first interconnect is recessed with respect to the first layer surface, wherein the first interconnect comprises a first interconnect surface and a first side surface adjacent the first interconnect surface;

a second layer coupled with the first interconnect surface, the first side surface adjacent the first interconnect surface, and the first material;

a third layer coupled with first interconnect surface and the second layer;

a fourth layer including a second interconnect and the first material, the fourth layer having a fourth layer surface and the second interconnect is recessed with respect to the fourth layer surface;

a fifth layer coupled with a second interconnect surface, a second side surface adjacent the second interconnect surface, and the first material; and a sixth layer coupled with the second interconnect surface and the fifth layer;

wherein the first material at least partially covers portions of the second layer coupled with the first interconnect surface, wherein the first material comprises carbon and oxygen, and wherein the second layer comprises silicon and nitrogen.

19. The substrate of claim 18, wherein:

the first material is spaced from portions of the fifth layer coupled with the second interconnect surface and the second side surface adjacent the second interconnect surface.

20. The substrate of claim 18, wherein:

the first material at least partially covers portions of the fifth layer coupled with the first interconnect surface.

21. The substrate of claim 20, wherein:

the second layer is directly coupled with the first interconnect surface, the first side surface adjacent the first interconnect surface, and the first material, the third layer is directly coupled with first interconnect surface and the second layer, the fifth layer is directly coupled with a second interconnect surface, a second side surface adjacent the second interconnect surface, and the first material, and the sixth layer is directly coupled with the second interconnect surface and the fifth layer.

22. The substrate of claim 21, wherein:

the third layer is to couple with a first solder ball, and the sixth layer is to couple with a second solder ball.

23. The substrate of claim 18, wherein:

the second layer is directly coupled with the first interconnect surface, the first side surface adjacent the first interconnect surface, and the first material, the third layer is directly coupled with first interconnect surface and the second layer, the fifth layer is directly coupled with a second interconnect surface, a second side surface adjacent the second interconnect surface, and the first material, and the sixth layer is directly coupled with the second interconnect surface and the fifth layer.

24. A substrate for an electronic device, the substrate comprising:

a first layer including a first interconnect and a first material, the first layer having a first layer surface and the first interconnect is recessed with respect to the first layer surface, wherein the first interconnect comprises a first interconnect surface and a first side surface adjacent the first interconnect surface;

a second layer directly coupled with the first interconnect surface, the first side surface adjacent the first interconnect surface, and the first material;

a third layer directly coupled with first interconnect surface and the second layer, the third layer configured for coupling with a first solder ball;

a fourth layer having a fourth layer surface, wherein:

the fourth layer includes a second interconnect and the first material;

the second interconnect is recessed with respect to the fourth layer surface;

a fifth layer coplanar with a portion of the second interconnect and directly coupled with the first material, wherein the fifth layer is spaced from the second interconnect; and a sixth layer directly coupled with the second interconnect surface, the sixth layer configured for coupling with a second solder ball;

wherein the first material is spaced from the second interconnect, wherein the first material at least partially covers portions of the second layer directly coupled with the first interconnect surface, wherein the first material comprises carbon and oxygen, and wherein the second layer comprises silicon and nitrogen.

25. The substrate of claim 24, wherein the first material is between the second interconnect and the fifth layer.

26. The substrate of claim 25, further comprising the second solder ball, and the second solder ball is directly coupled with the sixth layer and the first material.

27. The substrate of claim 25, further comprising one or more electrical routing traces included in the first layer, and the second layer is coupled with the one or more electrical traces.

28. A substrate for an electronic device, the substrate comprising:

a first layer including a first interconnect and a first material, the first layer having a first layer surface and the first interconnect is recessed with respect to the first layer surface, wherein the first interconnect comprises a first interconnect surface and a first side surface adjacent the first interconnect surface;

a second layer directly coupled with the first interconnect surface, the first side surface adjacent the first interconnect surface, and the first material; and a third layer directly coupled with first interconnect surface and the second layer, the third layer configured for coupling with a first solder ball, wherein the first material at least partially covers portions of the second layer directly coupled with the first interconnect surface, wherein the first material at least partially covers portions of the third layer directly coupled with the first interconnect surface, and wherein the second layer comprises silicon and nitrogen.

29. The substrate of claim 28, wherein the first material comprises carbon and oxygen.

30. The substrate of claim 28, further comprising:

a fourth layer including a second interconnect and the first material, the fourth layer having a fourth layer surface and the second interconnect is recessed with respect to the fourth layer surface;

a fifth layer directly coupled with a second interconnect surface, a second side surface adjacent the second interconnect surface, and the first material; and a sixth layer directly coupled with the second interconnect surface and the fifth layer, the sixth layer configured for coupling with a second solder ball.

31. The substrate of claim 30, wherein the first material is spaced from portions of the fifth layer directly coupled with the second interconnect surface and the second side surface adjacent the second interconnect surface.

* * * * *